(12) United States Patent
Chang et al.

(10) Patent No.: US 10,177,073 B2
(45) Date of Patent: Jan. 8, 2019

(54) WAFER LEVEL EMBEDDED HEAT SPREADER

(71) Applicant: Taiwan Semiconductor Manufacturing Company, Ltd., Hsinchu (TW)

(72) Inventors: Wei Sen Chang, Jinsha Township (TW); Tsung-Hsien Chiang, Hsinchu (TW); Yen-Chang Hu, Hsin-Chu (TW); Ching-Wen Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 14 days.

(21) Appl. No.: 15/641,116

(22) Filed: Jul. 3, 2017

(65) Prior Publication Data

US 2017/0301608 A1 Oct. 19, 2017

Related U.S. Application Data

(62) Division of application No. 13/623,474, filed on Sep. 20, 2012.

(51) Int. Cl.
*H01L 21/56* (2006.01)
*H01L 23/00* (2006.01)
(Continued)

(52) U.S. Cl.
CPC .... *H01L 23/4334* (2013.01); *H01L 23/49827* (2013.01); *H01L 23/5389* (2013.01); *H01L 24/73* (2013.01); *H01L 21/568* (2013.01); *H01L 23/49816* (2013.01); *H01L 24/16* (2013.01); *H01L 24/20* (2013.01); *H01L 24/83* (2013.01); *H01L 2224/12105* (2013.01); *H01L 2224/19* (2013.01); *H01L 2224/29139* (2013.01); *H01L 2224/32245* (2013.01); *H01L 2224/73267* (2013.01); *H01L 2224/83005* (2013.01);
(Continued)

(58) Field of Classification Search
CPC ....... H01L 23/5389; H01L 2224/92244; H01L 2224/19
See application file for complete search history.

(56) References Cited

U.S. PATENT DOCUMENTS 6,265,771 B1 7/2001 Ference et al.
6,282,095 B1 8/2001 Houghton et al.
(Continued)

*Primary Examiner* — Kenneth Parker
*Assistant Examiner* — Long H Le
(74) *Attorney, Agent, or Firm* — Slater Matsil, LLP

(57) ABSTRACT

Disclosed herein are a device having an embedded heat spreader and method for forming the same. A carrier substrate may comprise a carrier, an adhesive layer, a base film layer, and a seed layer. A patterned mask is formed with a heat spreader opening and via openings. Vias and a heat spreader may be formed in the pattern mask openings at the same time using a plating process and a die attached to the head spreader by a die attachment layer. A molding compound is applied over the die and heat spreader so that the heat spreader is disposed at the second side of the molded substrate. A first RDL may have a plurality of mounting pads and a plurality of conductive lines is formed on the molded substrate, the mounting pads may have a bond pitch greater than the bond pitch of the die contact pads.

20 Claims, 6 Drawing Sheets

(51) Int. Cl.
*H01L 23/433* (2006.01)
*H01L 23/498* (2006.01)
*H01L 23/538* (2006.01)

(52) U.S. Cl.
CPC ........... *H01L 2224/92244* (2013.01); *H01L 2924/00* (2013.01); *H01L 2924/181* (2013.01)

(56) References Cited

U.S. PATENT DOCUMENTS

| | | | |
|---|---|---|---|
| 7,247,523 B1 | 7/2007 | Huemoeller et al. | |
| 7,411,297 B2 | 8/2008 | Luo et al. | |
| 7,868,472 B2 | 1/2011 | Kelly | |
| 2002/0135065 A1* | 9/2002 | Zhao | H01L 23/16 257/738 |
| 2005/0277280 A1* | 12/2005 | Brunschwiler | H01L 21/4871 438/616 |
| 2006/0001152 A1* | 1/2006 | Hu | H01L 23/36 257/707 |
| 2006/0113663 A1 | 6/2006 | Yuan et al. | |
| 2006/0175692 A1 | 8/2006 | Hsu | |
| 2006/0186536 A1 | 8/2006 | Hsu | |
| 2007/0096292 A1* | 5/2007 | Machida | H01L 21/4857 257/700 |
| 2008/0157344 A1 | 7/2008 | Chen et al. | |
| 2008/0188083 A1* | 8/2008 | Jeon | H01L 21/0337 438/703 |
| 2008/0237828 A1 | 10/2008 | Yang | |
| 2009/0032933 A1 | 2/2009 | Tracht et al. | |
| 2009/0294947 A1* | 12/2009 | Tain | H01L 25/0657 257/686 |
| 2011/0148328 A1* | 6/2011 | Joseph | F21K 9/00 315/312 |
| 2011/0291249 A1 | 12/2011 | Chi et al. | |
| 2013/0056871 A1 | 3/2013 | Yu et al. | |

\* cited by examiner

WAFER LEVEL EMBEDDED HEAT SPREADER

PRIORITY CLAIM AND CROSS-REFERENCE

This application is a divisional of U.S. application Ser. No. 13/623,474, filed on Sep. 20, 2012 and entitled "Wafer Level Embedded Heat Spreader," which application is hereby incorporated by reference herein in its entirety.

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Furthermore, the use of more powerful processors in ever-shrinking package form factors leads to a thermal management issue. Increased device operating speeds, along with a greater transistor count on individual components, create heat in amounts that may damage or reduce the efficiency of the components. Furthermore, tighter package integration and more compact device bring more heat generating devices into smaller areas, concentrating the heat generated.

BRIEF DESCRIPTION OF THE DRAWINGS

For a more complete understanding of the present embodiments, and the techniques involved in making and using the same, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale. For clarity non-essential reference numbers are left out of individual figures where possible.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely making and using embedded heat spreaders useful in, for example, wafer level processor assemblies. Other embodiments may also be applied, however, to other electrical components, including, but not limited to, memory assemblies, displays, input assemblies, discrete components, power supplies or regulators or any other embedded components.

The presented disclosure is directed to providing a system and method for creating an embedded heat spreader for an active device, embedded processor, die, chip, discrete component or the like. An embedded heat spreader may permit a heat generating component to dissipate heat or transfer heat from the component, reducing the heat load on the component, particularly under prolonged use. Providing a heat spreader for an embedded die may permit greater die reliability and longer die life.

Figure 1:
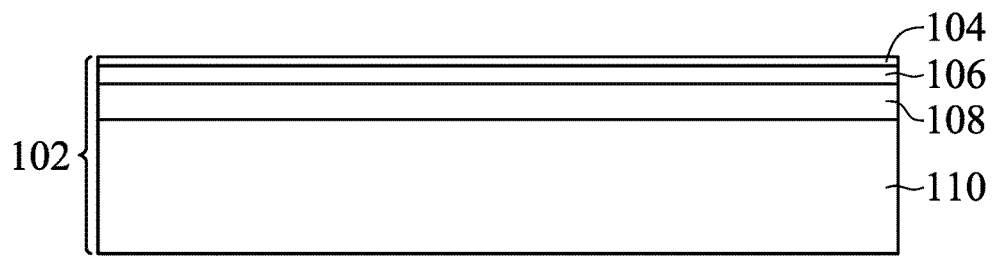
FIGS. 1-7 are cross-sectional diagrams illustrating intermediate steps in an embodiment of a method for forming an embedded heat spreader.

Referring to FIG. 1, a cross-section of an embodiment of an intermediate step for forming a wafer level embedded heat spreader is depicted. A carrier substrate 102 may comprise a carrier 110 that may be configured to provide structural rigidity or a base for deposition of subsequent non-rigid layers. In one embodiment, the carrier 110 may be a glass carrier, but may alternatively be a wafer, semiconductor, metal, synthetic or other material having a suitable topography and structural rigidity.

A glue or adhesive layer 108 may, in some embodiments, be applied to the carrier 110, with an optional base film layer 106 and optional seed layer 104 applied over the adhesive layer 108. In one embodiment, the adhesive layer 108 may be adhesive tape, or alternatively, may be a glue or epoxy applied to the carrier 110 via a spin-on process, or the like. In some embodiments, the adhesive layer 108 may be used to separate the carrier 110 from the heat spreader assembly and associated devices or layers in subsequent steps.

The seed layer 104 may be formed over the adhesive layer 108 and may act as a base for subsequent metal plating or deposition steps. In some embodiments, the seed layer 104 may be used as an electrode in a subsequent electroplating process. The seed layer 104 may be deposited via physical vapor deposition (PVD), chemical vapor deposition (CVD), including, but not limited to Plasma enhanced CVD (PECVD), low pressure CVD (LPCVD), Atomic layer CVD, via atomic layer deposition, sputtering, electrochemical deposition, or another suitable method. In some embodiments, the seed layer 104 may be copper, and in other embodiments, the seed layer may be gold, aluminum tantalum, nickel, alloys of the same, or another material or alloy.

The base film layer 106 may, in some embodiments, be applied and formed of a material that advantageously permits later layers to properly form. For example, in one non-limiting embodiment, the base film layer 106 may be formed of a polymer such as polybenzoxazole (PBO). In such an embodiment, the PBO may be applied to the adhesive layer 108, where used, or optionally, applied directly to the carrier 110 via spin coating, or the like. A curable polymer such as PBO permits application of the base film layer 106 through a spin coating process, but is still capable of forming a substantially firm base film through curing. Additionally, PBO may be advantageous because the flexible structure created after curing acts as a buffer between materials with different coefficients of expansion (CoE). For example, in one embodiment, the carrier 110 may be glass, and have a CoE much lower than a seed layer 104 made from, for example, copper. In such an embodiment, a semi-rigid base film layer 106 may act to buffer the different expansions curing thermal processing. However, any suitable material may be used as the base film layer 106.

Figure 2:
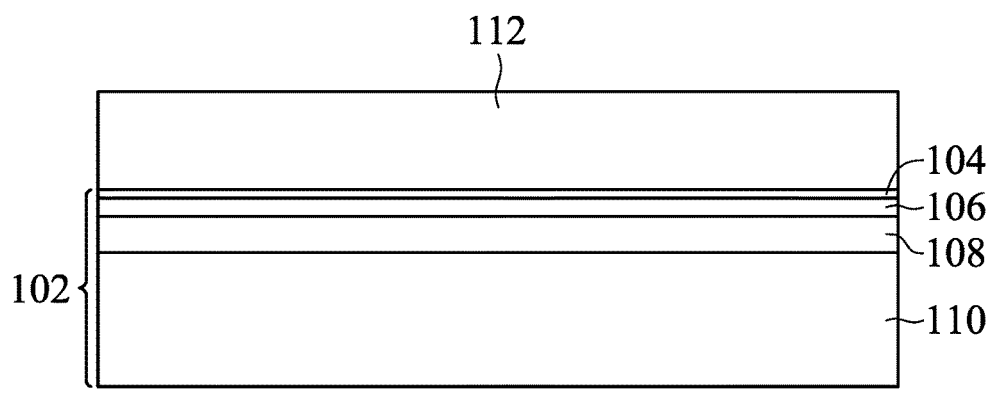

FIG. 2 depicts a cross-sectional view of an embodiment of an intermediate step for forming a wafer level embedded heat spreader. A mask layer 112 may be applied over the seed layer 104. In some embodiments, the mask layer 112 may be a photoresist applied via a spin-on process. In other embodiments, the mask layer 112 may be a hard mask such as a nitride, oxide, oxynitride or the like. A mask layer 112 that is a hard mask may be applied by PVD, CVD, or via another suitable deposition method.

Figure 3:
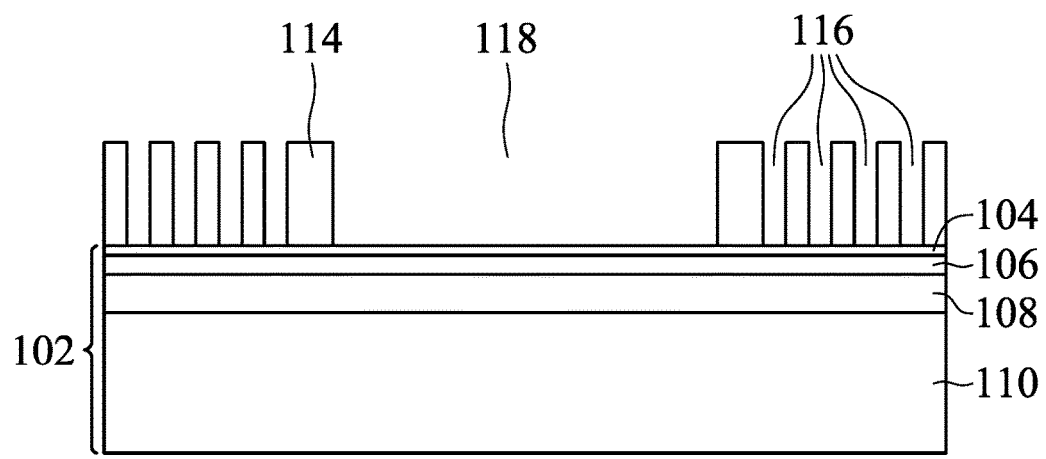

FIG. 3 depicts a cross-sectional view of an embodiment of an intermediate step for forming a wafer level embedded heat spreader using a patterned mask 114. The mask layer 112 is patterned and developed to form the patterned mask 114. The mask layer 112 may be patterned to form patterned mask 114 having a heat spreader opening 118 and optionally, one or more via openings 116. In one embodiment, the patterned mask may be formed so that the structures created in the via openings 116 may be initially formed to a height of about 105 μm, then subsequently ground, polished, etched, or otherwise reduced to height of about 80 μm to about 90 μm. In some embodiments, the via openings 116 in the patterned mask 114 may have a pitch of around 110 μm and diameter of about 70 μm. Thus the structures formed in the via openings 116 will have a resulting height-to-width ratio of 1.5:1 after formation.

Figure 4:
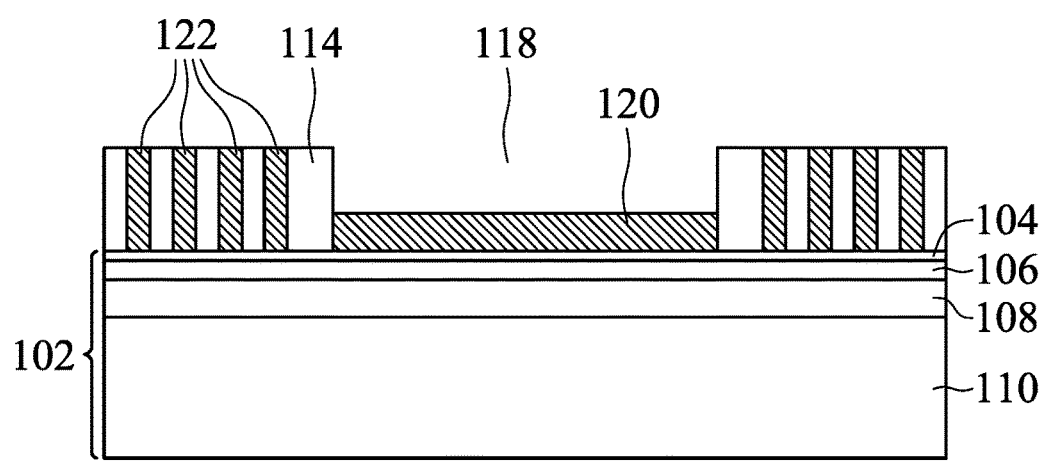

FIG. 4 depicts a cross-sectional view of formation of the heat spreader 120 according to some embodiments of the disclosure. In one embodiment, the heat spreader 120 may be deposited via a plating process such as a through-aperture-via (TAV) plating process. In some embodiments, the heat spreader 120 may be formed in the same step as one or more vias 122. For example, one non-limiting embodiment may be where copper is plated on the seed layer 104 to fill the via openings 116 and the lower portion of the heat spreader opening 118 to form the vias 122 and heat spreader 120, respectively. This may be accomplished, for example, by a copper electroplating process where the carrier substrate 102 with the patterned mask 114 applied is submerged in a copper solution with a current applied, resulting in buildup of copper on the seed layer 104. Alternatively, an electroless plating process, CVD, PECVD or another metal deposition process may be employed to form the heat spreader 120 and vias 122. The thickness of the heat spreader 120 may depend on the area of the heat spreader 120 and the number of vias 122. For example, in some embodiments, there may be 1200 vias 122, and the heat spreader 120 may be formed to a thickness between about 3 μm and about 5 μm.

While the process for forming the heat spreader 120 and via 122 may take place using a plating process and at the same time, in another embodiment, forming the heat spreader 120 and any vias 122 may be performed in multiple steps. For example, the vias 122 may be formed in a first plating step, and then the heat spreader 120 formed or placed in a subsequent step. In such an embodiment, the patterned mask 114 may be formed without the heat spreader opening 118, but with the via openings 116. The vias 122 may be formed in the via openings 116, and the heat spreader opening 118 may be formed after the vias 122 are formed. The heat spreader 120 may then be formed in the heat spreader opening 118 after the vias 122 are already formed. In such an embodiment, the vias 122 may be masked or covered during the formation of the heat spreader 120. A multi-step metal deposition procedure may permit application of different materials for the vias 122 and heat spreader 120. For example, a copper heat spreader 120 may be formed after vias 122 formed from, for example, gold, are created.

The embedded heat spreader 120 may also, in another embodiment, be formed separately, and then applied to the carrier substrate 102. In such an embodiment, the heat spreader 120 may, for example, be milled, molded or otherwise formed away from the carrier substrate 102, and then applied to the adhesive layer 108, the base film layer 106, or the seed layer 104. In such an embodiment, the seed layer 104, which may not be required or advantageous since the heat spreader 120 is being placed instead of formed in situ, may be eliminated, and the heat spreader 120 applied to the base film layer 106, adhesive layer 108, or to the carrier 110 directly.

Figure 5:
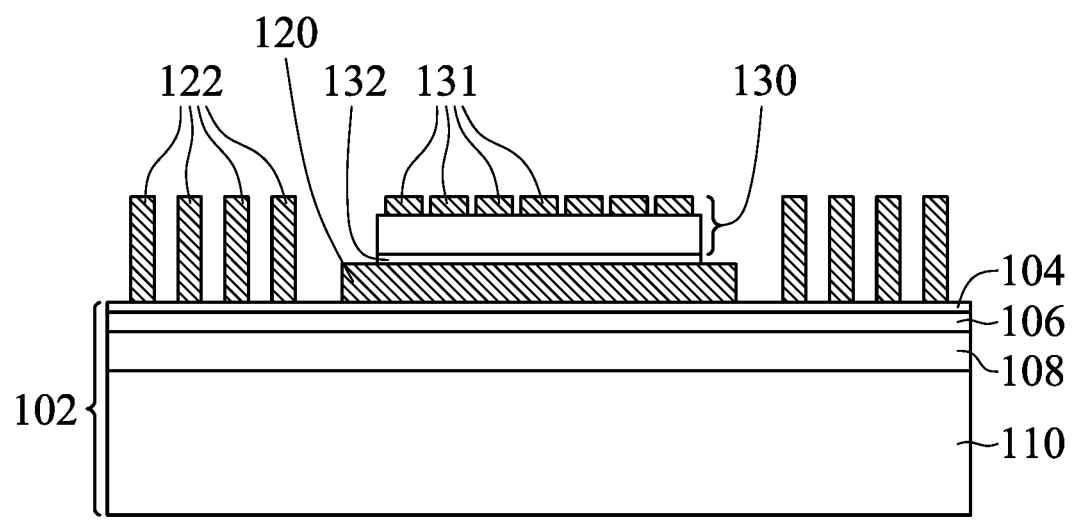

FIG. 5 depicts a cross-sectional view of application of an active device such as a die 130 to the heat spreader 120 according to some embodiments of the disclosure. The patterned mask 114 is removed after formation of the vias 122 and heat spreader 120. For example, in embodiments where the mask layer 112 was formed by a photoresist, the resulting patterned mask 114 may be removed via ashing and an optional rinse or cleaning. In embodiments where the mask layer 112 was formed by a hard mask, the resulting patterned mask 114 may be removed by etching the pattern mask to leave the underlying carrier substrate 102.

A die 130 is applied to the heat spreader using a die attachment layer 132 such as a die attachment film (DAF) or the like. In some embodiments, the die attachment layer 132 may have thermal characteristics sufficient to bring the die 130 into thermal contact with the heat spreader 120. In some embodiments, the die attachment layer 132 may be a thermal compound having, for example, a silver content sufficient to transfer an amount of heat from the die 130 to the heat spreader 120 to permit the die 130 to operate while generating a predetermined heat output. Thus, the die attachment layer 132 may transmit sufficient heat energy from the die 130 to the heat spreader 120, lowering or maintaining the temperature of the die 130 when the die is operating within a predetermined range. Such temperature management may permit the die 130 to operate at a higher speed or capacity for longer periods of time while maintaining the integrity of the die 130 components.

In some embodiments, the die 130 may be attached to the heat spreader 120 by attaching the top, or non-contact, side of the die 130 to the heat spreader 120 by the die attachment layer 132. Thus, the die 130 may be placed so that a first side of the die 130 having one or more contact pads 131 or mounting pads of the die 130 is opposite a second side of the die 130 that is mounted to the heat spreader 120.

Figure 6:
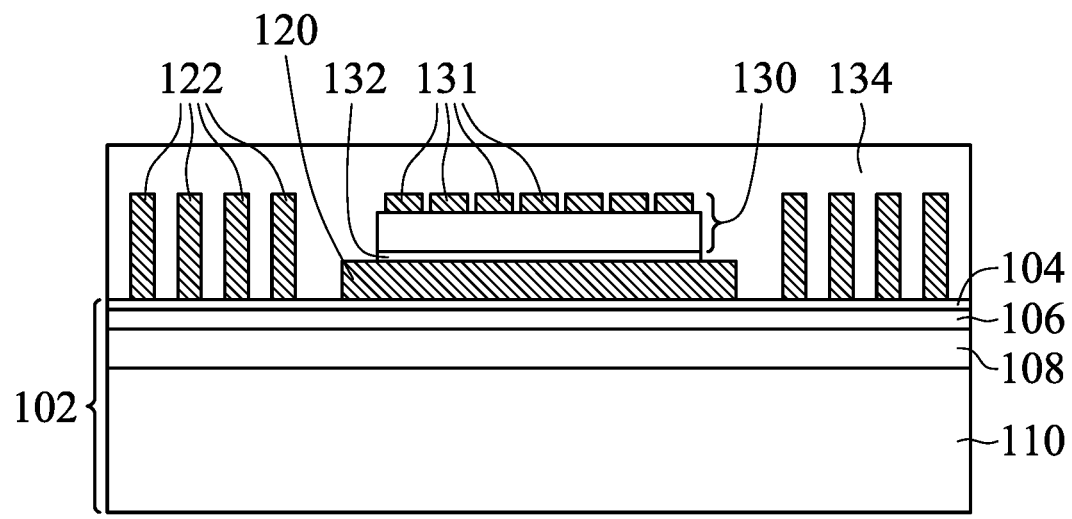

FIG. 6 depicts a cross-sectional view of application of a molding compound 134 to embed the heat spreader 120. The molding compound 134 may be a flowable compound having a high dielectric constant. In some embodiments, a mold or other enclosure for retaining the moldable compound may be used to form the molding compound 134. In such an embodiment, an epoxy or similarly liquid molding compound 134 may be effectively used to form the molded substrate 800. Additionally the molding compound 134 may be cured after application. For example, the molding compound 134 may be an epoxy that uses a catalyst, and cures after application. Alternatively, the molding compound 134 may be cured through application of a catalyst after application, for example, curing a molding compound via ultraviolet exposure, or through exposure to air, or the like.

Figure 7:
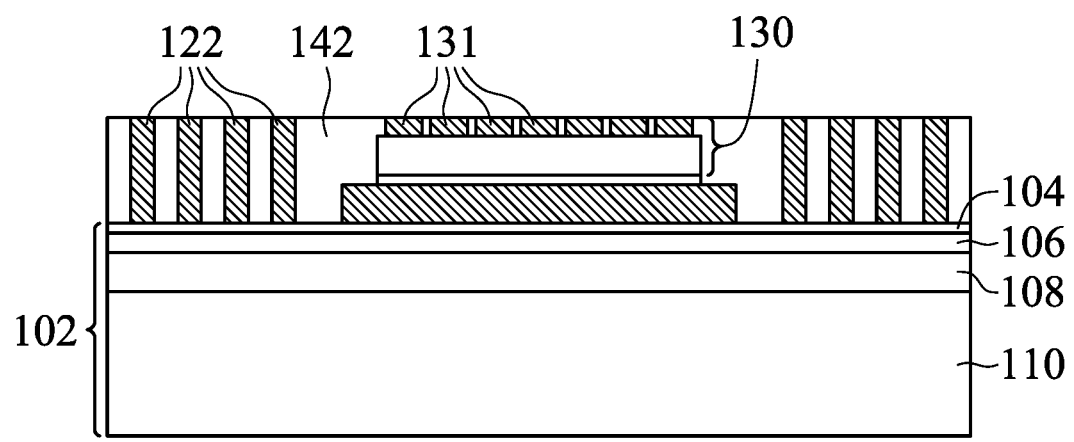

FIG. 7 illustrates a polished or reduced molding compound 142 according to some embodiments of the disclosure. The molding compound 134 may undergo a grinding step to remove excess material from the die 130 contact pads 131 and vias 122. In such an embodiment, the molding compound 134 may be subjected to a chemical-mechanical polish, a purely mechanical polish, chemical etching, or another suitable reduction process. The resulting reduced molding compound 142 may, in some embodiments, have a top surface at or below the top surfaces of the vias 122 and the die 130 contact pads 131. Thus, the vias 122 and die 130 contact pads 131 may be exposed at the polished side of the reduced molding compound 142 such that electrical contacts may be formed on the vias 122 and die 130 contact pads 131. In some embodiments, the grinding may also reduce the height of the vias 122 to about 80 µm to about 90 µm, resulting in a height-to-width ratio between about 1.1:1 and about 1.3:1.

Figure 8:
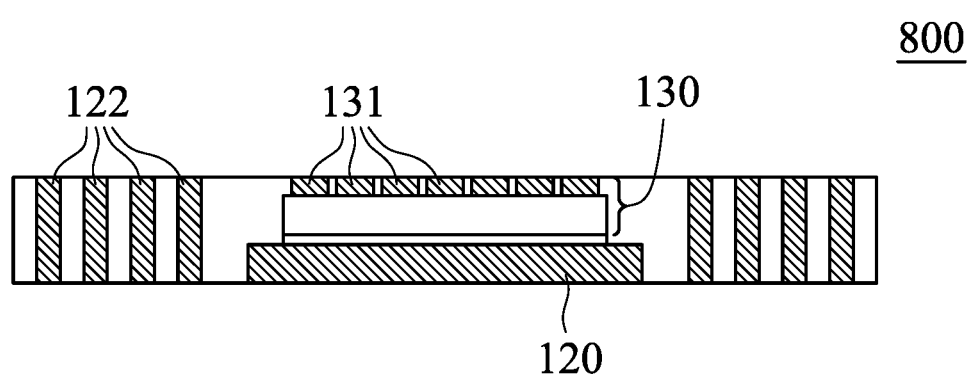
FIG. 8 is a cross-sectional diagram illustrating a molded substrate with heat spreader assembly.

FIG. 8 illustrates a molded substrate 800 after debonding from the carrier substrate 102. The carrier 110 may be separated from the molded substrate 800 at the adhesive layer 108, and any remaining adhesive layer 108 material, and any base film layer 106 or seed layer 104 material may be removed by, for example, etching, polishing or the like. The resulting molded substrate 800 may have the die 130 contact pads 131 exposed on a first side and the heat spreader 120 disposed, and exposed, at a second, opposite side.

Figure 9:
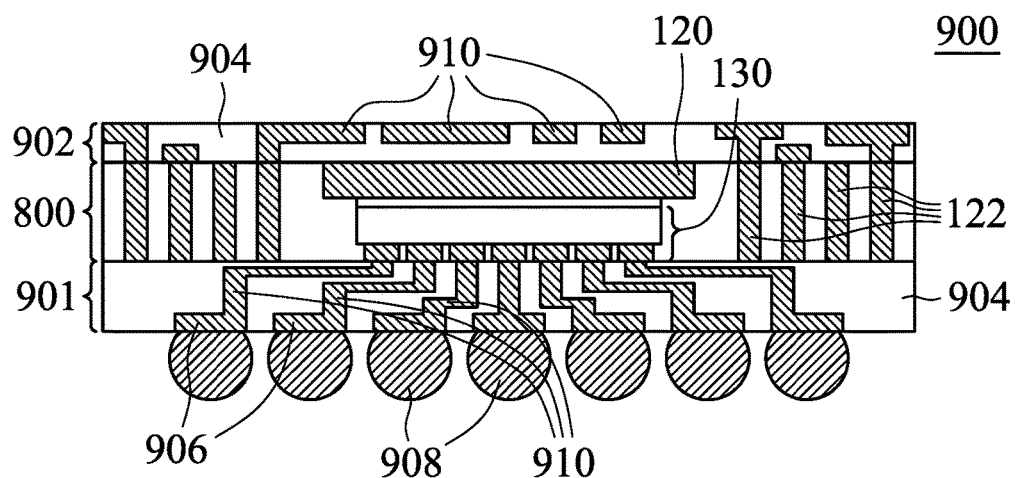
FIGS. 9-10 are cross sectional diagrams of embodiments of a wafer level device with embedded heat spreader.

FIG. 9 depicts a wafer level assembly 900 having an embedded heat spreader 120 according to an embodiment of the disclosure. The molded substrate 800 may have a first redistribution layer (RDL) 901 disposed on one side and one or more second RDLs 902 disposed on an opposite side. The first RDL 901 may, in some embodiments, have one or more conductive lines 910 disposed in an intermetal dielectric (IMD) 904, and in electrical contact with contact pads 131 on the die 130. The conductive lines 910 may be arranged to provide an electrical connection between contact pads 131 on the die 130 and RDL contact pads 906. The conductive lines 910 may fan out from the die 130 contact pads 131 such that the RDL contact pads 906 may have a larger bond pitch than the die 130 contact pads 131, and which may be suitable for a ball grid array 908 or other package mounting system. While the first RDL 901 is illustrated having conductive lines 910 configured to fan out and provide an electrical connection between the die 130 contact pads 131 and RDL contact pads 906, the first RDL 901 is not limited to such embodiments. In some embodiments, the first RDL 901 may also have conductive lines 910 that connect one or more vias 122 to the RDL contact pads 906. In yet another embodiment, the conductive lines 910 may electrically connect, for example, a via 122 to another via 122, to a die 130 contact pad, or to another die or device disposed in the molded substrate 800.

Additionally, an embodiment of a heat spreader 120 formed larger than the die 130 is shown. In some embodiments, the heat spreader 120 may be substantially the same size or footprint as the die 130, resulting in a reduced area required to form the heat spreader 120. The heat spreader 120 may be substantially larger than the die 130 to provide a greater heat dissipation or absorption capacity. The heat spreader 120 may be formed as large as allowed by the requirements of via 122 placement and boundaries of the molded substrate 800.

Similarly, the second RDL 902 disposed on the opposite side of the molded substrate 800 from the first RDL 901 may have one or more conductive lines 910 disposed in an IMD 904 or other dielectric material. The second RDL 902 conductive lines 910 may interconnect the vias 122, or may connect the vias to one or more other devices or elements disposed in, or outside of, the wafer level assembly 900.

In some embodiments, the second RDL 902 may be disposed over the heat spreader 120, and the region over the heat spreader 120 may include conductive lines 910. Thus, the second RDL 902 may be disposed over a portion of the heat spreader 120, and a portion of a conductive line 910 may also be disposed over the heat spreader 120. Such an embodiment may be employed where components or vias 122 that are disposed on opposite sides of the heat spreader 120 are connected to each other.

Thus, a wafer level assembly 900 having an embedded heat spreader 120 may, in some embodiments, be a device comprising a substrate 800, a die 130 disposed in the substrate and having contact pads 131 disposed on a first side of the die 130 and exposed through a first side of the substrate 800 and where a heat spreader 120 may further be in thermal contact with the die 130 and disposed at a second side of the substrate 800. Additionally, the heat spreader 120 may be disposed at a second side of the die 130 and configured to transfer heat from the die 130. In some embodiments, at least one via 122 may be disposed in the substrate 800 and extending from the first side of the substrate 800 to the second side of the substrate 800.

In some embodiments, a first RDL 901 may be disposed on the first side of the substrate 800, and may have at a plurality of RDL contact pads 906 and at least one conductive line 910 electrically connecting contact pads 131 on the die 130 to the RDL contact pads 906. Furthermore, the RDL contact pads 906 may have a bond pitch greater than the bond pitch of the contact pads 131. A second RDL 902 may also be disposed on the substrate 800 opposite the first RDL 901, and may have conductive lines in contact with the vias 122. The second RDL 902 is disposed on and may cover the heat spreader 120. Additionally, a portion of at least one conductive line 910 may be disposed over the heat spreader 120. In some embodiments, a die attachment layer 132 disposed between, and in contact with, the second side of the die 130 and the heat spreader 120. The die attachment layer 132 may optionally be a die attachment film, and may bond the heat spreader 120 and the die 130.

Figure 10:
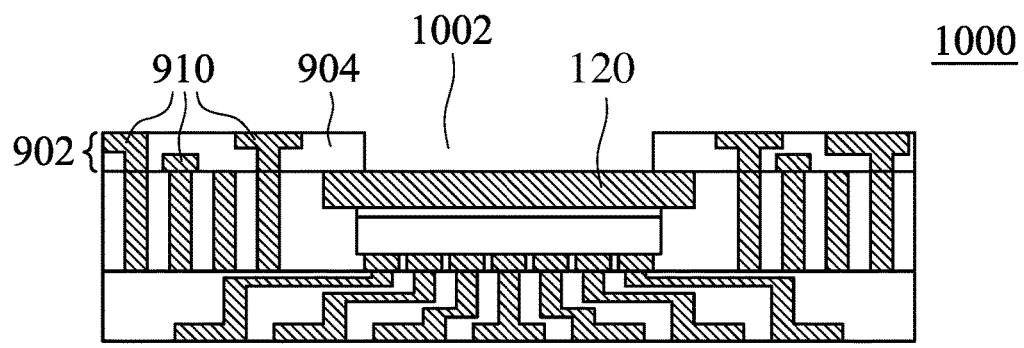

FIG. 10 depicts a wafer level assembly 1000 having an embedded heat spreader 120 according to another embodiment of the disclosure. In some embodiments, the second RDL 902 may be formed to have a heat exposure opening 1002. This may permit greater airflow over the heat spreader 120, resulting in more efficient heat radiation, and permitting the heat spreader 120 to shed excess heat into the surrounding or outside environment. In such embodiments, the conductive lines 910 in the second RDL 902 may be routed around the heat exposure opening 1002. In some embodiments, the heat exposure opening 1002 may be formed during IMD 904 creation by, for example, masking the heat exposure opening 1002. In other embodiments, the heat exposure opening 1002 may be etched or otherwise created over the heat spreader 120 after the IMD 904 is created.

In some embodiments, the second RDL 902 may cover only a portion of the heat spreader 120. In other embodiments, the second RDL 902 may completely avoid the surface of the heat spreader 120 to expose an entire surface of the heat spreader 120. Thus, a heat spreader 120 larger than the die 130 may be formed, with a portion of the second RDL 902 covering only a portion of the heat spreader 120, and with a portion of the heat spreader 120 exposed. In such an embodiment, one or more conductive lines 910 may be routed through the second RDL 902 over the heat spreader 120, allowing the heat spreader 120 to be formed without interfering with the layout of the second RDL 902 conductive lines 910.

Figure 11:
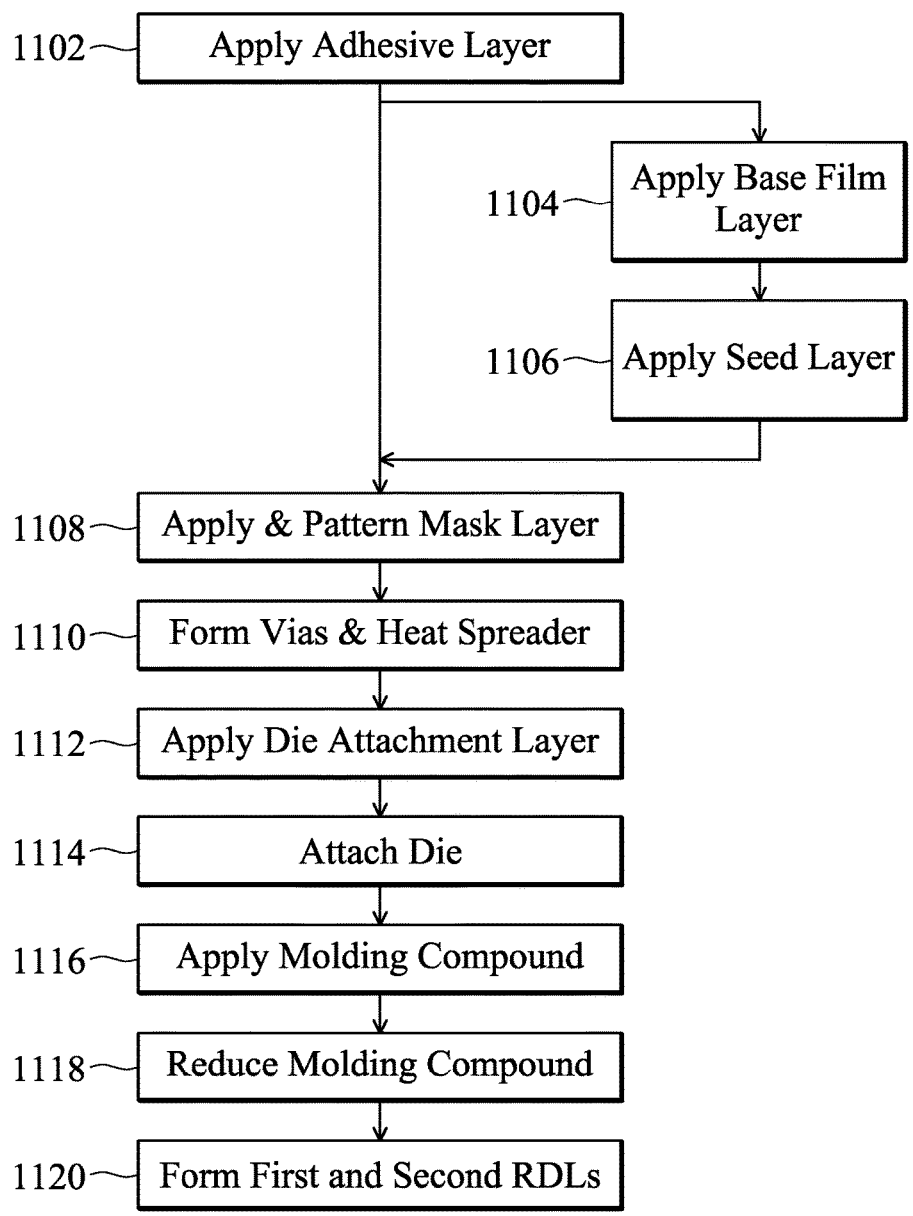
FIG. 11 is a flow chart illustrating a method for forming a wafer level assembly having an embedded heat spreader.

FIG. 11 is a flow chart illustrating a method 1100 for forming a wafer level assembly 900 having an embedded heat spreader 120. A carrier substrate 102 may be formed by providing a carrier 110 and applying an adhesive layer 108 on the carrier 110 in block 1102. A base film layer 106 may optionally be applied on the adhesive layer 108 in block 1104. A seed layer 104 may optionally be applied on the base film layer 106 in block 1106. A patterned mask 114 having a heat spreader opening 118 may be formed on the carrier substrate 102 in block 1108 by applying and patterning the mask layer 112. A heat spreader 120 and vias 122 may be formed in the patterned mask 114 in block 1110. A die attachment layer 132, which may optionally be a die attachment film, may be applied on the heat spreader 120 in block 1112. A die 130 having a plurality of contact pads 131 disposed on a second side of the die 130 may be mounted via a first side on the die attachment layer 132 in block 1114. A molding compound 142 may be applied over the die 130 and heat spreader 120 to create a molded substrate 800 in block 1116 so that the contact pads 131 of the die 130 are exposed at the first side of the molded substrate 800, and so that the heat spreader 120 is disposed at the second side of the molded substrate 800. The carrier 110 may be subsequently debonded from the device 900. The vias 122 and the heat spreader 120 may be formed at the same time using a plating process or another suitable metal deposition process.

In some embodiments, the wafer level assembly 900 creation method 1100 may further comprise forming a first RDL 901 on the first side of the molded substrate 800 in block 1120. The first RDL 901 may have a plurality of RDL contact pads 906 and a plurality of conductive lines 910, each conductive line 910 providing an electrical connection between a mounting pad 906 and a contact pad of the die 130. In additional embodiments, the RDL contact pads 906 may have a bond pitch greater than the bond pitch of the die 130 contact pads 131. A second RDL 902 may also be formed on the second side of the molded substrate 800 in block 1120 and may cover at least a portion of the heat spreader 120 and have at least one conductive line 910 in electrical contact with at least one via 122.

In some embodiments, a method includes forming a patterned mask over a carrier substrate, the patterned mask having a heat spreader opening; forming a heat spreader over the carrier substrate in the heat spreader opening; removing the patterned mask after forming the heat spreader; mounting a die over the heat spreader, where the die is in thermal contact with the heat spreader; and applying a molding compound over the die and over the heat spreader, where the die is proximate a first side of the molding compound, and where the heat spreader is proximate a second side of the molding compound.

In some embodiments, a method includes forming a patterned mask layer over a carrier, the patterned mask layer having a first opening with a first width and a second opening with a second width, the first width being larger than the second width; forming a heat spreader in the first opening; forming a conductive via in the second opening; removing the patterned mask layer; attaching a die to the heat spreader; and forming a molding material over the carrier, where the die, the via and the heat spreader are embedded in the molding material.

In some embodiments, a method includes forming a patterned mask over a carrier, the patterned mask having a first opening and a second opening; forming a heat spreader in the first opening; forming a conductive via in the second opening, where the heat spreader has a width larger than a width of the conductive via, and the heat spreader has a height smaller than a height of the conductive via; and removing the patterned mask. The method further includes attaching a die to the heat spreader; embedding the die, the conductive via and the heat spreader in a molding material; forming a first redistribution structure at a first side of the molding material; attaching external connectors to contact pads of the first redistribution structure; and forming a second redistribution structure at a second side of the molding material opposing the first side, where the heat spreader is proximate the second side of the molding material.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, heat spreaders 120 may be virtually any shape, for example, to avoid vias or conform to the boundaries of the molded substrate 800. Heat spreader 120 may also be any heat conductive material, such as ceramic or pother non-metallic material, where such material is called for. As another example, it will be readily understood by those skilled in the art that many of the steps for creating a wafer level embedded heat spreader structure may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A method comprising:
   forming a patterned mask over a carrier substrate, the patterned mask having a heat spreader opening and a via opening;
   forming a via in the via opening;
   forming a heat spreader over the carrier substrate in the heat spreader opening, wherein forming the via and forming the heat spreader comprise performing a plating process to form the via and the heat spreader at a same processing step;
   removing the patterned mask after forming the heat spreader;
   mounting a die over the heat spreader, wherein the die is in thermal contact with the heat spreader; and
   applying a molding compound over the die and over the heat spreader, wherein the die is proximate a first side of the molding compound, and wherein the heat spreader is proximate a second side of the molding compound.

2. The method of claim 1, wherein the die is mounted to the heat spreader by a die attachment film.

3. The method of claim 1, wherein forming the patterned mask comprises:
applying an adhesive layer on a first side of a carrier;
applying a base film layer on the adhesive layer;
forming a mask layer on the base film layer; and
patterning the mask layer to form the via opening and the heat spreader opening, thereby forming the patterned mask.

4. The method of claim 3, further comprising reducing a height of the via opening and a height of the heat spreader opening after the patterning.

5. The method of claim 3, wherein forming the patterned mask further comprises forming a seed layer between the base film layer and the mask layer.

6. The method of claim 1, further comprising, after forming the molding compound, forming a first redistribution structure on the first side of the molding compound, the first redistribution structure having a plurality of contact pads and a plurality of conductive lines, a first one of the plurality of conductive lines providing an electrical connection between a first contact pad of the plurality of contact pads and a contact pad of the die.

7. The method of claim 6, further comprising forming a second redistribution structure on the second side of the molding compound, the second redistribution structure having at least one conductive line in electrical contact with the via.

8. The method of claim 7, further comprising providing an opening in the second redistribution structure exposing at least a portion of the heat spreader.

9. A method comprising:
forming a patterned mask layer over a carrier, the patterned mask layer having a first opening with a first width and a second opening with a second width, the first width being larger than the second width, each of the first opening and the second opening exposing sidewalls of the patterned mask layer;
forming a conductive via in the second opening;
placing a heat spreader in the first opening;
removing the patterned mask layer;
attaching a die to the heat spreader; and
forming a molding material over the carrier, wherein the die, the via and the heat spreader are embedded in the molding material.

10. The method of claim 9, further comprising:
removing the carrier; and
forming a first redistribution structure at a first side of the molding material, wherein contact pads of the die are exposed at the first side of the molding material, where the first redistribution structure is electrically coupled to the contact pads of the die.

11. The method of claim 10, further comprising forming a second redistribution structure at a second side of the molding material opposing the first side of the molding material, wherein the second redistribution structure has an opening that exposes the heat spreader.

12. The method of claim 9, wherein the heat spreader has a width larger than a width of the die.

13. The method of claim 9, wherein forming the conductive via and placing the heat spreader are performed in a same processing step.

14. The method of claim 9, wherein forming the conductive via and placing the heat spreader are performed in different processing steps.

15. The method of claim 14, wherein the via is formed of a first material, and the heat spreader is formed of a second material different from the first material.

16. The method of claim 14, wherein the heat spreader is pre-formed, and wherein placing the heat spreader comprises attaching the pre-formed heat spreader to the carrier substrate.

17. The method of claim 9, further comprising forming a redistribution structure over the heat spreader, wherein the redistribution structure is formed to have an opening that exposes at least a portion of the heat spreader.

18. The method of claim 9, further comprising forming a redistribution structure over the heat spreader, wherein the redistribution structure has a conductive line disposed directly over the heat spreader.

19. A method comprising:
forming a patterned mask over a carrier, the patterned mask having a first opening and a second opening;
placing a heat spreader in the first opening;
forming a conductive via in the second opening, wherein the heat spreader has a width larger than a width of the conductive via, and the heat spreader has a height smaller than a height of the conductive via;
removing the patterned mask;
attaching a die to the heat spreader;
embedding the die, the conductive via and the heat spreader in a molding material;
forming a first redistribution structure at a first side of the molding material;
attaching external connectors to contact pads of the first redistribution structure; and
forming a second redistribution structure at a second side of the molding material opposing the first side, wherein the heat spreader is proximate the second side of the molding material, wherein forming the second redistribution structure comprises forming an opening in the second redistribution structure, the opening exposing the heat spreader.

20. The method of claim 19, wherein placing the heat spreader comprises performing a plating process to form the heat spreader.

* * * * *